United States Patent [19]
Jacob

[11] 3,951,843
[45] Apr. 20, 1976

[54] FLUOROCARBON COMPOSITION FOR USE IN PLASMA REMOVAL OF PHOTORESIST MATERIAL FROM SEMICONDUCTOR DEVICES

[75] Inventor: Adir Jacob, West Roxbury, Mass.

[73] Assignee: LFE Corporation, Waltham, Mass.

[22] Filed: Nov. 8, 1973

[21] Appl. No.: 413,884

Related U.S. Application Data

[60] Division of Ser. No. 322,134, Jan. 9, 1973, Pat. No. 3,806,365, which is a continuation of Ser. No. 173,537, Aug. 20, 1971, abandoned.

[52] U.S. Cl............................ 252/187 R; 252/79.1; 252/172; 252/186; 252/372
[51] Int. Cl.² ......................................... C09K 13/00
[58] Field of Search ............ 252/67, 172, 364, 372, 252/DIG. 9, 79.1, 187 R, 186; 156/2, 17

[56] References Cited
UNITED STATES PATENTS

| | | | |
|---|---|---|---|
| 1,386,497 | 8/1921 | Henning................................ | 252/67 |
| 2,999,817 | 9/1961 | Bower.................................... | 252/172 |
| 3,340,199 | 9/1967 | Clay et al........................... | 252/67 X |
| 3,455,835 | 7/1969 | Burt.................................. | 252/67 X |
| 3,615,956 | 10/1971 | Irving et al............................ | 156/17 |
| 3,630,926 | 12/1971 | Haase et al. .................... | 252/364 X |
| 3,654,108 | 4/1972 | Smith.................................. | 204/164 |
| 3,795,557 | 3/1974 | Jacob................................. | 252/79.1 |
| 3,816,198 | 6/1974 | La Combe ........................ | 156/17 X |

*Primary Examiner*—Edward A. Miller
*Attorney, Agent, or Firm*—Kenway & Jenney

[57] ABSTRACT

A organo-halide composition for use in the manufacture of semiconductor devices. To enable the removal of all the photoresist material along with its inorganic contamination, after development and etching of preselected portions of an oxide layer on a semiconductor slice, the material is exposed to a low pressure (few torr) rf generated "cold" plasma (200°–300°C), where the plasma is a homogeneous gaseous mixture of oxygen and organohalides. The organo-halide preferably is a binary or ternary mixture where each component preferably includes no more than two carbon atoms per molecule and is desirably fully halogensubstituted. One of the substituents should include predominantly chlorine, while the other should include a predominance of either fluorine or fluorine-bromine combinations.

3 Claims, 2 Drawing Figures

3,951,843

FLUOROCARBON COMPOSITION FOR USE IN PLASMA REMOVAL OF PHOTORESIST MATERIAL FROM SEMICONDUCTOR DEVICES

This is a division, of application Ser. No. 322,134 filed Jan. 9, 1973, now U.S. Pat. No. 806,365, which is a continuation of U.S. Ser. No. 173,537 filed Aug. 20, 1971, now abandoned.

FIELD OF THE INVENTION

This invention relates in general to a process and material useful in analytical procedures, and more particularly to a process and material useful in the manufacture of semiconductor devices, enabling the simultaneous removal of both photoresist films and their embedded inorganic contaminants during the processing of such devices.

BACKGROUND OF THE INVENTION

In one conventional technique for the manufacture of semiconductor devices, a slice of semiconductor material (p or n-type) accepts a relatively thin layer, typically 5,000 to 10,000A, of oxide grown on both of its surfaces. A layer of photoresist material is then spun on to the oxide of one side, and is subsequently exposed to UV light through a mask having openings corresponding to those areas on the semiconductor slice where it is desired to generate semiconductor junctions. After exposure of the photoresist material through the mask, the mask is removed and the layer of photoresist is developed and processed by means of a suitable solvent, exposing the underlying oxide layer. An acid dip is then used to etch the oxide from the surface of the semiconductor slice in the exposed areas, the remaining photoresist material serving as an etch-barrier for the oxide surface covered by it. Following the etching process, a water rinse and a drying cycle are implemented. The remainder of the photoresist material is subsequently removed, followed by an acid dip required for the removal of inorganic residues. Following a drying step, diffusion of dopant material into the exposed areas of the semiconductor slice (where there is no oxide) is commenced to produce a predetermined junction.

One of the problems associated with this particular technique arises from the step of removing the residual masking photoresist along with its inorganic contaminants prior to the diffusion stage. This step may be carried out by either one of two conventional techniques.

One technique employs a wet chemical process in which the residual photoresist is removed by application of a solvent. The solvent, however, does not simultaneously remove inorganic contaminants embedded in the photoresist material. These contaminants predominantly include tin, iron and magnesium metals, with much smaller traces of lead, copper, zinc, nickel, chromium, aluminum, calcium, titanium, sodium and manganese. Even in the purified versions of photoresist material, the tin concentration may be 130 parts per million, while that of iron and magnesium may be 5 to 10 parts per million. These contaminants, left on the oxide layer after the photoresist has been removed, cause faulty operation of the resultant semiconductor device. Consequently, an additional rather hazardous acid dip is required. There are a number of photoresist materials available in the market of which only a few have particularly desirable characteristics of adhesion and resistance to the etching acids. The product of Eastman Kodak Company identified as KMER is a case in point. As a result of its superior characteristics, excellent resolution and definition of the semiconductor junction areas may be achieved by its utilization. However, this photoresist material, even after purification, has a relatively significant level (>100 parts per million) of contamination of tin. This tin residue exhibits undesirable effects as a contaminant on semiconductor and/or semiconductor oxide surfaces in terms of: (1) crystallization of the oxide and breakdown of its passivating properties leading to extraneous diffusions, (2) precipitations in the semiconductor acting as getters for the dopants leading to uncontrollable sheet resistivity, (3) induced charges in the oxide giving rise to electrical instabilities, junction leakage and uncontrollable drifts. Additional drawbacks of the wet chemical approach, involve the contamination of the solvents and their associated short shelf-life, as well as the continuing cost coupled with their use and the inconvenience in rinsing and drying procedures prior to the diffusion step.

A second technique, which has been employed, is a dry plasma stripping process in which the semiconductor device coated with the photoresist material is exposed to an oxygen discharge which degrades and volatilizes the organic photoresist material. This step, however, does not remove the inorganic materials embedded in the photoresist layer, but undesirably generates a very thin layer, of 50 to 75A of semiconductor oxide on the previously exposed portions of the semiconductor slice. This oxide layer is, of course, disadvantageous in the subsequent diffusion step, since it serves as a partial diffusion barrier for junction formation, and consequently an additional etching step to remove this oxide prior to diffusion is required.

SUMMARY OF THE INVENTION

The process of the present invention employs a gas mixture for the generation of a low pressure plasma having unique characteristics which not only decomposes and volatilizes the residual organic photoresist material, but which also simultaneously effects a significant reduction in the quantity of inorganic contamination, particularly that of tin, iron and magnesium, which otherwise remains left on the structure of a semiconductor device. The plasma formed from this particular gas mixture also prevents the exposed area of the semiconductor slice from being covered by an undesired oxide film.

It has been discovered that if the generated plasma includes not only active oxygen, but also reactive species resulting from a gas mixture of organo-halides that include, as the substituted halogens, both chlorine and either fluorine or fluorine-bromine combinations, the photoresist material will be removed and simultaneously with it the inorganic contaminants. Typically, these contaminants can be reduced to a concentration corresponding to 0.1 to 0.5 percent of a monoatomic layer. It is believed that the process is one in which the tin contaminant reacts with the chlorine-based active species to form basically $SnCl_4$ which, at the ambient temperatures encountered, is volatile, and therefore carried away in the gas phase with the main gas stream. It is also believed that the halogen-based active species in this plasma prevent the formation of undesirable oxide film due to reduction of net active oxygen content and/or by etching of such films, thus substantially rendering oxide-free exposed semiconductor areas.

While a number of materials have exhibited acceptable operating characteristics for removal of inorganic residues, the optimum mixture for removal of photoresist and its inorganic contaminants appears to be a 70–30 percent liquid binary mixture (by volume) of trichlorethylene with 1, 1, 2 Trichloro - 1, 2, 2 Trifluoroethane, respectively, added to the oxygen stream. In general, the organo-halides must exhibit substantial vapor pressure at room temperature in order to result in an effective gaseous composition, typically greater than 50 torr at 25°C, and should have no more than two carbon atoms per molecule. The substituted halogens should include chlorine and either fluorine or fluorine-bromine combinations.

DESCRIPTION OF PREFERRED EMBODIMENTS

Figures 1, 2:
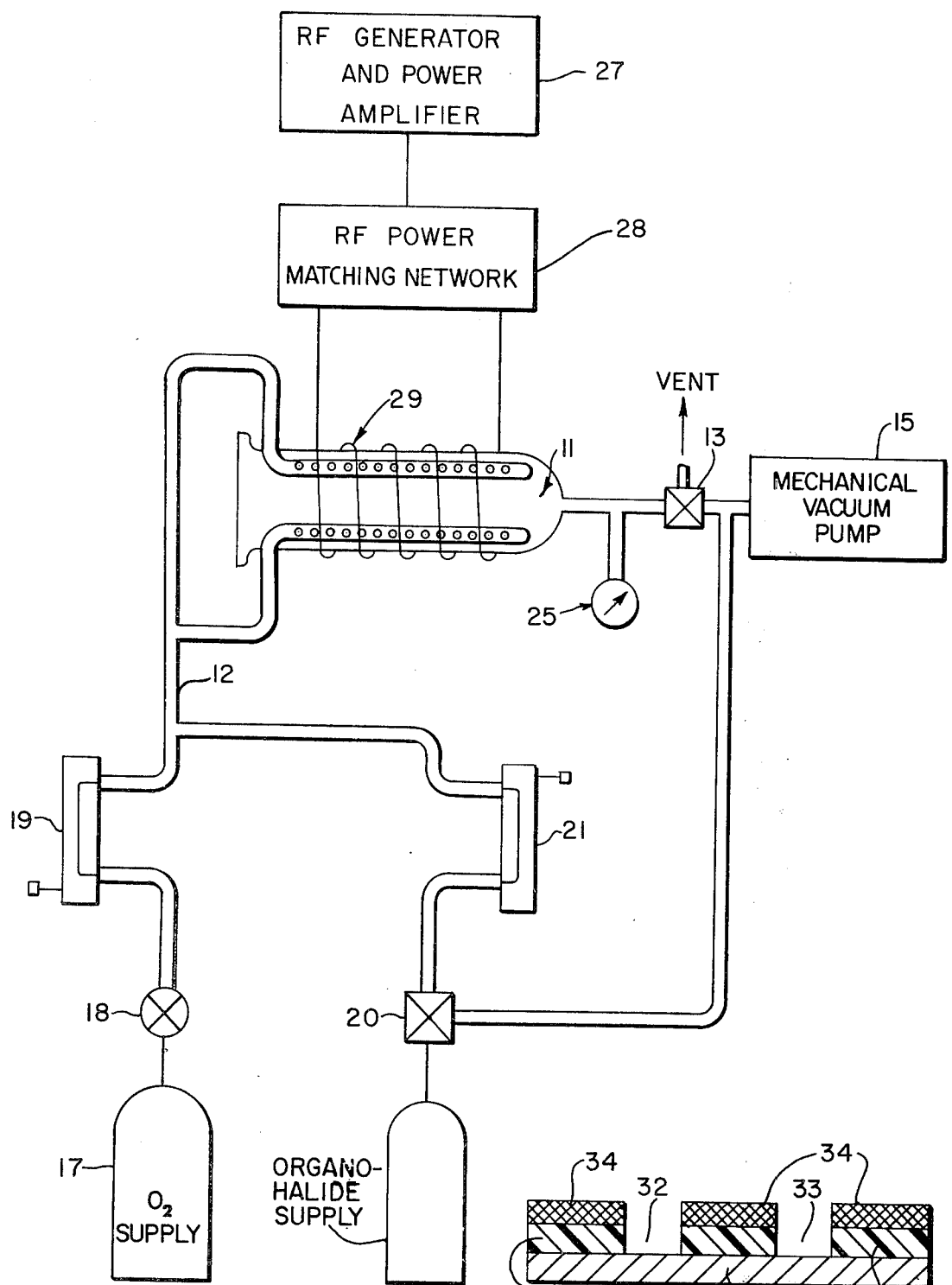
FIG. 1 is an illustration in diagrammatic form of a reactor system useful in the process of this invention.
FIG. 2 is an illustration in cross-sectional view of a typical semiconductor chip at an intermediate stage of the manufacturing process.

FIG. 1 depicts diagrammatically an apparatus for use in performing the process described in the invention. The apparatus includes a glass reactor chamber 11, typically made of quartz, provided with a gas inlet manifold 12. A pressurized molecular oxygen supply 17 is connected through a pressure regulating valve 18 and flowmeter 19 to manifold 12. Also connected to manifold 12 through a three-way solenoid valve 20 and flow monitoring device 21 is a liquid supply 22 of mixed organo-halides maintained under its own vapor pressure of about 170 torr at 25°C. A vacuum gauge 25 provides an indication of total reaction pressure in reactor 11. At any time and prior to introduction of organo-halide vapor to manifold 12, the corresponding flow lines are constantly evacuated through the three-way solenoid valve 20 leading to the mechanical vacuum pump 15, this being the case also under conditions where atmospheric pressure prevails in reactor 11 through the utilization of the three-way isolation solenoid valve 13. A source of radio-frequency power 27 is coupled through a matching network 28 to inductance 29 surrounding the reaction chamber 11. In operation, a mixture of oxygen and organo-halide vapor is admitted to reaction chamber 11, where the inductively coupled radio-frequency energy creates a "cold" plasma. The semiconductor material to be processed is placed within reactor 11, where it is exposed to the plasma. Such a reaction chamber is commercially available from the Process Control Division of LFE Corporation, under the trade designation PDS 302AQIR or PDS 504AQIR. Typically, the rf power per reactor is between 150 to 175W continuous radiation at 13.5 MH$_z$.

The general process is one in which up to 25 semiconductor wafers at an appropriate stage of the manufacturing process are placed in reactor 11 and exposed to the plasma generated by the admission of an appropriate vapor mixture of organo-halides and oxygen gas. For the appropriate reactions to take place, and in order to enable an effective process, it is important that this homogeneous mixture be formed prior to its entering the reaction chamber so that prescribed competitive-consecutive action will take place when the discharge strikes. As will be discussed below, if the main reactions involved in photoresist stripping and inorganic residue removal should follow sequentially, and not simultaneously, the process loses much of its effectiveness.

In FIG. 2 there is shown in cross-sectional view, a portion of a semiconductor device at a suitable processing stage for the utilization of this invention. The semiconductor chip 30 having a relatively thin (2000 to 10,000A) layer of oxide 31 on its upper surface, would almost always be silicon covered with a silicon dioxide film serving as a diffusion barrier, although other semiconductor materials may either have a deposited silicon dioxide film or another passivation film despoited onto them. This oxide layer has been etched at openings 32 and 33 due to corresponding openings in the overlying photoresist layer 34. These windows correspond to positions on the semiconductor slice where it is desired to form junctions by a subsequent diffusion of suitable dopants. At this stage of the process, it is necessary, prior to diffusion into openings 32 and 33, to remove the photoresist layer 34 along with any inorganic contaminants that may be embedded in it. It is equally important that no oxide film be formed on exposed areas of the semiconductor material in openings 32 and 33.

If the semiconductor structure, as depicted in FIG. 2, is exposed to the prescribed plasma formed from a gaseous mixture of oxygen and organo-halides vapor, the photoresist material will be eliminated and its associated inorganic contaminants substantially reduced, inhibiting the presence of an oxide film on the exposed areas of the semiconductor slice in openings 32 and 33. It has been found that an effective organo-halide vapor or gas should be formed from a mixture of organo-halides wherein each component in the mixture is selected from the group of halocarbons having no more than two carbon atoms per molecule. and in which the carbons are attached to one kind of halogen or to mixed halogens of several kinds. If a liquid halocarbon mixture is considered, each of its components should have a boiling point between 20° and 120°C associated with a vapor pressure of 50 to 270 torr at 25°C. Preferably, one component of the liquid organo-halide mixture should include chlorine as a sole substituent while other components of the mixture may include chlorine but should, in addition, include either fluorine, or fluorine-bromine atom combinations. The gaseous mole fraction of the component containing the fluorine substituent at equilibrium with the mother liquid should be within 0.1 to 0.75. The preferred vapor mixture is produced from a liquid mixture containing 30 percent by volume of 1, 1, 2 Trichloro - 1, 2, 2 Trifluoroethane and 70 percent Trichloroethylene. In practice, this mixture is supplied as being under its own vapor pressure of 166 torr at room temperature. This structure corresponds to a gaseous mole fraction of the fluorine-containing component of 0.7. However, satisfactory results were achieved with a liquid mixture of up to 50 percent by volume of these components. In general, for the compounds in the aforementioned group, an increase in the number of carbon atoms per molecule tends to slow down both the process of photoresist stripping and the simultaneous removal of inorganic contaminants, while an increase in the mole fraction of the fluorine-containing component tends to result in excessive etching of the oxide layer 31. Too little fluorine, however, may result in permitting oxidation of exposed semiconductor surfaces.

The successful operation of this process is believed to include competitive reactions in the plasma, such that intended) prior to entering the reaction chamber, with the oxygen flow constituting about 80 to 99 percent of the total gaseous flow.

TABLE I

| Gases | Flow Rate | Comment |
|---|---|---|
| $CHCl_2F$ | 4.4 micromoles/sec | low efficiency; order of magnitude less than optimum |
| $CH_3Cl$ | 5.85 micromoles/sec | low efficiency; order of magnitude less than optimum |
| $CH_3Cl/CH_3Br$ (1,1) | 2.6 to 4.4 micromoles/sec | moderately efficient |
| Liquids | (mixture range by volume % in liquid state) | |
| $CCl_2FCF_2Cl/CHCl=CCl_2$ (binary mixture) | .75/99.25 to 50/50 | moderate to high efficiency |
| $CCl_2FCF_2Cl/CHCl=CCl_2/CCl_3F$ (ternary mixture) | approx. same ranges as above with $CCl_3<10\%$ | moderate to high efficiency |
| $CCl_2FCF_2Cl/CHCl=CCl_2/CCl_3F/CF_2BrCF_2Br$ (quarternary mixture) | approx. same ranges as above with $CCl_3F$ and $CF_2BrCF_2Br$ each less than 10% | moderate to high efficiency |
| $CH_2BrCl$ | — | efficiency down from optimum by factor of 5–10 |
| $C_2H_5Br$ | — | efficiency down from optimum by factor of 5–10 |
| $C_2H_5Br/CH_2ClCH_2Cl$ (binary mixture) | 1:1 | efficiency down from optimum by factor of 5–10 |
| $CCl_2FCF_2Cl/C_2H_5Br$ (binary mixture) | 1:1 | efficiency down from optimum by factor of 5–10 | relatively slow free electrons have a higher probability (larger cross sections) of attachment to fluorine rather than to chlorine or oxygen, thus reducing the concentration of negative chlorine atoms (that assume an inert electronic configuration) thereby facilitating a correspondingly more efficient attack of neutral active chlorine atoms on the predominant tin residues. The presence of halogen atoms and halogen atom-containing radicals reduces the net concentration of active oxygen, thus suppressing oxide growth on exposed semiconductor areas. A corresponding decrease in photoresist stripping by active oxygen is presumably offset by photoresist degradation due to halogen-based active species. Since $Cl^-$ ions have a lower chemical affinity toward elemental metals than neutral Cl atoms, the abundance of the latter, which is enabled due to preferential formation of $F^-$ ions, is believed to be a main precursor in converting tin residues to volatile tin tetrachloride ($SnCl_4$) that escapes (with the main gas stream) to the pump. The photoresist material is degraded and volatilized principally by the reaction with active oxygen, and presumably also by reaction with the halogen-based active species. It is imperative that the plasma simultaneously contain both active oxygen and the excited halocarbon and halogen components, since an initial exposure of a semiconductor slice (FIG. 2) to an oxygen plasma and its subsequent exposure to a halogen-based discharge would be interposed by an undesirable oxidation of tin to tin oxide along with an equally undesirable oxidation of exposed semiconductor surfaces. Under such circumstances, the halogens and halogen-based active species could not effectively volatilize the oxidized inorganic materials, because of an inherent endothermicity (lack of driving energy) associated with such a reaction. The relatively low reaction temperature (generally below 250°C) could hardly account for surmounting the inherent potential barrier associated with the reaction.

It has been found that the mixtures set forth below in Table I within the range of mixture composition as designated, produce acceptable results in the process described. These gases are intended to be premixed with molecular oxygen (if photoresist stripping is also In the following examples, suitable conditions for operating the process of this invention are set forth for two different organo-halide mixtures utilizing an oxygen gas carrier.

EXAMPLE I

Binary mixture of $CCl_2FCF_2Cl/CHCl=CCl_2$ (reagent grade). Values given for a single reactor chamber loaded with 20 to 25 two inch diameter slices coated with 1.2 microns of prepurified KMER photoresist.

Reactor being evacuated to <0.1 torr prior to introduction of gaseous mixture.
$O_2$ Flow Rate : 125 to 150 scc/min
Total Pressure : 1.1 to 1.25 torr
Mechanical Vacuum System : 330 lit./min via an acid resistant molecular sieve (7–9A) charged foreline trap.
RF Forward Power : 175 Watts (Reflected Power <2%)
Exposure Time : 15 to 25 min.
Typical Operating Steady State Temperature : ~250°C.

| Binary mixture expressed as volume % of $CCl_2FCF_2Cl$ in liquid phase (%) | Mixture vapor pressure at 25°C (torr) | Flow rate of vapor (gr/hr) ** |
|---|---|---|
| 1.5 | 80 | 4 to 11 |
| 6 | 93 | 0.1 to 6.5 |
| 10 | 102 | 0.1 to 8 |
| 30 * | 166 | 1 to 2.5 |
| 50 | 221 | 0.5 to 2.6 |

* Optimum mixture
** One gram/hr. equals 1.63 micromoles/sec.

The utilization of the 50 percent mixture was effective in removing lead, copper, zinc, nickel, chromium and aluminum, along with a substantial reduction in iron and tin content embedded in a photoresist film.

EXAMPLE II

Binary gaseouos mixture of $CH_3Cl/CH_3Br$ Same values for operating parameters and oxygen flow rate as in Example I. Gas mixture (1:1); flow rate 2.6 to 4.5 micromoles/sec.

What is claimed is:

1. A composition of matter, useful in a mixture with oxygen in a process for plasma removal of photoresist material in manufacturing semiconductors, comprised of a liquid mixture of $CCl_2FCF_2Cl$ (1, 1, 2 Trichloro-1, 2, 2 Trifluoroethane) and $CHCl=CCl_2$ within range of 0.75 to 50 percent by volume of $CCl_2FCF_2Cl$ (1, 1, 2 Trichloro-1, 2, 2 Trifluoroethane) of the liquid mixture.

2. A composition of matter, useful in a mixture with oxygen in a process for plasma removal of photoresist material in manufacturing semiconductors, comprising a liquid mixture of $CCl_2FCF_2Cl$ (1, 1, 2 Trichloro-1, 2, 2 Trifluoroethane) and $CHCl=CCl_2$ with $CCl_2FCF_2Cl$ (1, 1, 2 Trichloro-1, 2, 2 Trifluoroethane) constituting 30 percent by volume of the liquid mixture.

3. A composition of matter, useful in a process for plasma removal of photo-resist material in manufacturing semiconductors, comprising a gas mixture of oxygen, $CH_3Cl$ and $CH_3Br$ with the mole fraction of $CH_3Cl$ being equal to that of $CH_3Br$.

* * * * *

UNITED STATES PATENT AND TRADEMARK OFFICE
CERTIFICATE OF CORRECTION

PATENT NO. : 3,951,843
DATED : April 20, 1976
INVENTOR(S) : Adir Jacob

It is certified that error appears in the above-identified patent and that said Letters Patent are hereby corrected as shown below:

Column 1, line 6 "U.S. Pat. No. 806,365" should read: --U.S. Pat. No. 3,806,365--;

Column 6, line 64 "gaseouos" should read --gaseous--;

Column 4, line 14 "despoited" should read --deposited--;

Column 4, line 38 delete the period (.) between molecule and and.

Signed and Sealed this

Thirteenth Day of July 1976

[SEAL]

Attest:

RUTH C. MASON
Attesting Officer

C. MARSHALL DANN
Commissioner of Patents and Trademarks